US010185800B2

(12) United States Patent
Eyring et al.

(10) Patent No.: US 10,185,800 B2
(45) Date of Patent: Jan. 22, 2019

(54) APPARATUS AND METHOD FOR THE MEASUREMENT OF PATTERN PLACEMENT AND SIZE OF PATTERN AND COMPUTER PROGRAM THEREFOR

(71) Applicant: KLA-Tencor Corporation, Milpitas, CA (US)

(72) Inventors: Stefan Eyring, Weilburg (DE); Frank Laske, Weilmünster (DE)

(73) Assignee: KLA-Tencor Corporation, Milpitas, CA (US)

( * ) Notice: Subject to any disclaimer, the term of this patent is extended or adjusted under 35 U.S.C. 154(b) by 232 days.

(21) Appl. No.: 15/112,529

(22) PCT Filed: Jun. 27, 2016

(86) PCT No.: PCT/US2016/039531
§ 371 (c)(1),
(2) Date: Jul. 19, 2016

(87) PCT Pub. No.: WO2018/004511
PCT Pub. Date: Jan. 4, 2018

(65) Prior Publication Data
US 2018/0165404 A1 Jun. 14, 2018

(51) Int. Cl.
*G06F 17/50* (2006.01)
*G01B 15/00* (2006.01)
(Continued)

(52) U.S. Cl.
CPC ......... *G06F 17/5081* (2013.01); *G01B 15/00* (2013.01); *G01B 21/00* (2013.01); *G03F 1/36* (2013.01); *H01L 22/00* (2013.01)

(58) Field of Classification Search
USPC .................................. 716/51, 52, 53, 54, 55
See application file for complete search history.

(56) References Cited

U.S. PATENT DOCUMENTS 5,841,520 A 11/1998 Taniguchi
6,333,786 B1 12/2001 Uzawa et al.
(Continued)

FOREIGN PATENT DOCUMENTS

GB 2300275 10/1996
JP 2006-278799 10/2006
(Continued)

OTHER PUBLICATIONS

ISA/KR, International Search Report for PCT/US2016/039531 dated Dec. 8, 2016.

*Primary Examiner* — Brian Ngo
(74) *Attorney, Agent, or Firm* — Hodgson Russ LLP (57) ABSTRACT

An apparatus and a method are disclosed for the measurement of pattern placement and/or edge placement and/or size of a pattern on a surface of a substrate for the semiconductor industry. At least one source for detection and at least one assigned detector are used to measure the positions of a pattern on a substrate. With a movable stage the substrate is moved while detection takes place. A displacement measurement system determines the position of the movable stage during the movement. A computer is used for correlating detected signals of the at least one detector along the derived trace line with the actual positions of the stage during the movement of the stage.

19 Claims, 7 Drawing Sheets

(51) Int. Cl.
 G01B 21/00 (2006.01)
 G03F 1/36 (2012.01)
 H01L 21/66 (2006.01)

(56) References Cited

U.S. PATENT DOCUMENTS

| | | |
|---|---|---|
| 6,462,343 B1 | 10/2002 | Choo |
| 6,984,838 B2 | 1/2006 | Kosugi |
| 7,245,354 B2 | 7/2007 | Granik |
| 7,675,633 B2 | 3/2010 | Schmidt |
| 7,823,295 B2 | 11/2010 | Rinn |
| 7,871,004 B2 | 1/2011 | Smith et al. |
| 8,196,068 B2 | 6/2012 | Zhang |
| 8,248,618 B2 | 8/2012 | Rinn et al. |
| 8,352,886 B2 | 1/2013 | Laske et al. |
| 8,582,113 B2 | 11/2013 | Heiden |
| 2005/0105102 A1 | 5/2005 | Nguyen et al. |
| 2013/0250095 A1* | 9/2013 | Inoue .................... G06T 7/0004 348/94 |
| 2013/0322737 A1* | 12/2013 | Murakami .............. G06T 7/001 382/149 |
| 2016/0070971 A1* | 3/2016 | Nakashima ............... G06T 7/74 348/87 |

FOREIGN PATENT DOCUMENTS

| | | |
|---|---|---|
| JP | 2007214388 | 8/2007 |
| WO | 2014/074813 | 5/2014 |

\* cited by examiner

Prior art

APPARATUS AND METHOD FOR THE MEASUREMENT OF PATTERN PLACEMENT AND SIZE OF PATTERN AND COMPUTER PROGRAM THEREFOR

FIELD OF THE INVENTION

The present invention refers to an apparatus for the measurement of pattern placement and/or of a size of a pattern on a surface of a substrate for the semiconductor industry.

Furthermore, the present invention refers to a method for measuring pattern placement and/or a size of a pattern on a surface of a substrate for the semiconductor industry.

Additionally, the present invention refers to a computer program product disposed on a non-transitory computer readable medium for the measurement of pattern placement and/or a size of a pattern on a surface of a substrate for the semiconductor industry.

Furthermore, apparatus, method, and computer program product of the invention more generally are provided for measuring edge placement on a surface of a substrate for the semiconductor industry; measuring edge placement includes measuring pattern placement and pattern size, as the distance between two edges of a pattern relates to a size of the pattern, and the position of the edges of a pattern define a position of the pattern.

BACKGROUND OF THE INVENTION

There are several prior art methods which target individual use cases (e.g., overlay metrology, pattern placement metrology, and critical dimension (CD) metrology).

Overlay metrology is mainly based on optical imaging or scatterometry. The ARCHER series of KLA-Tencor Corporation can be used for the optical overlay control. The mechanical, electrical, and optical set-up of the products of the ARCHER series are incorporated herein by reference in their entirety.

Pattern placement metrology is typically used on reticles only, thereby combining accurate stage position metrology and optical imaging. Pattern placement metrology can be carried out by the IPRO series of KLA-Tencor Corporation. The mechanical, electrical, and optical set-up of the products of the IPRO series are incorporated herein by reference in their entirety.

CD metrology may for example be carried out with a scanning electron microscope (SEM) in on-target and device pattern SEM imaging. CD metrology may for example also be performed with KLA-Tencor's IPRO metrology tool.

The TERON Series of KLA-Tencor Corporation provide 193 nm-wavelength reticle inspection systems. The TERON Series is designed for photomask defect inspection of optical and EUV reticles during both development and production. The products of the TERON series are incorporated herein by reference in their entirety.

International patent application PCT/US13/69138 with the international filing date of Sep. 24, 2013, describes a method and system for performing model-based registration and critical dimension measurement. At least one simulated image of the measurement site is generated. At least one parameter of the computer model is adjusted to minimize dissimilarities between the simulated images and the optical images. The pattern registration parameter or the critical dimension parameter of the computer model are reported when dissimilarities between the simulated images and the optical images are minimized.

U.S. Pat. No. 8,248,618 which issued on Aug. 21, 2012 and is incorporated by reference herein, describes one example for the pattern placement metrology. The method is suitable for reticles only and combines accurate stage position metrology and optical imaging. The method is implemented in a metrology tool comprising a measurement table which is movable in X-coordinate direction and Y-coordinate direction. A first intensity profile is recorded along a first measurement direction, which is parallel to the X-coordinate direction. A second intensity profile is recorded along a second measurement direction, which is parallel to the Y-coordinate direction. A two-dimensional position of a center of gravity with respect to the coordinate system of the metrology tool is determined from the first intensity profile and the second intensity profile.

U.S. Pat. No. 7,675,633, which issued on Mar. 9, 2010 and is incorporated by reference herein, describes one possible method for CD metrology. The measuring method is used for measuring at least one structure on the substrate, wherein the measuring includes the position and/or the width of the structure.

Additionally, several other US patents, like U.S. Pat. No. 8,582,113, U.S. Pat. No. 8,352,886, or U.S. Pat. No. 7,823,295, disclose devices or methods for determining the positions of structures on a mask.

The prior art methods use rather static approaches. Optical imaging is limited in resolution. On-device pattern CD and registration metrology is a big challenge due to missing contrast at specific small feature sizes. CD-SEM metrology uses an electron beam directed at a location to be measured. Charging and damage effects may occur that can affect the pattern physically or lead to inaccurate metrology.

SUMMARY OF THE INVENTION

It is an object of the invention to provide an apparatus designed to measure the position and the size of patterns, or the position of at least one edge of a pattern, on a surface of a substrate for the semiconductor industry, wherein such measurement is carried out with high precision and accuracy in a very fast way.

The above object is achieved by an apparatus for the measurement of pattern placement and/or of a size of a pattern and/or of a position of at least one edge of a pattern on a surface of a substrate for the semiconductor industry. The apparatus has at least one source for detection and at least one detector assigned to the at least one source for detection. A movable stage holds the substrate and provides a relative movement along a chosen track curve. The relative movement is between the at least one source for detection and the assigned detector, on the one hand, and the surface of the substrate on the other hand. A displacement measurement system is configured to determine the actual positions of the movable stage relative to the source for detection and the assigned detector during the movement of the movable stage. From this information a trace line is derived. Finally, at least one data processing device is assigned for correlating detected signals of the at least one detector along the derived trace line with the actual positions of the stage during the movement of the stage. The data processing device may for example be a dedicated arrangement of integrated circuits (IC) or other specialized hardware, located for example, without being restricted thereto, on one or several printed circuit boards, or may for example be one or plural field programmable gate arrays (FPGA), or any further suitable data processing device, including one or plural personal computers, workstations, mainframe computers, all of these on-site or remote, or cloud-based data processing systems. In the case of plural computers, these may be sharing the tasks to be performed by a computer in relation to the method, apparatus, and computer program product of the invention, and may be located at one site or distributed between plural sites. In what follows, all these types of data processing device will be referred to by the term computer.

A further object of the invention is to provide a method for measuring a position and/or a size of a pattern and/or a position of at least one edge of a pattern on a surface of a substrate for the semiconductor industry, wherein the measurement of the pattern placement is carried out with high precision and accuracy in a very fast way.

The above object is achieved by a method for measuring pattern (or edge) placement and/or a size of a pattern on a surface of a substrate for the semiconductor industry, the method comprising the steps of:

a. carrying out a data preparation for generating at least one desired track curve along which a relative movement between at least one source for detection and at least one assigned detector and the surface of the substrate is directed;

b. repeatedly evaluating measurement data of detector signals from the patterned surface of the substrate during the movement of a movable stage and monitoring in parallel the movement of the movable stage;

c. generating a measured profile from the measurement data along a trace line, wherein the measured profile represents the measured placement of the pattern on the surface of the substrate;

d. evaluating the measured profile in order to determine a position of an edge or of a pattern, or a CD on the patterned surface.

In an embodiment of the method evaluating the measured profile in order to determine a position of an edge or of a pattern, or a CD on the patterned surface, is carried out by performing the further steps e. a generating a design profile from design data of the design database along the trace line; and f. comparing the measured profile and the design profile along the same trace line in order to determine a position of an edge or of a pattern, or a CD along the same trace line on the patterned surface and/or to detect placement errors or CD errors along the same trace line on the patterned surface.

Repeatedly evaluating measurement data here includes both a continuous or quasi-continuous evaluation of measurement data during the movement of the movable stage, like for example, but not limited to, a sensitive element (e.g. CCD in case the source emits light) of the detector being operated to produce output data at the highest rate it is capable of, and a "step and grab" approach, wherein the source is positioned at discrete defined locations along the track curve and measurement data are evaluated for each of these locations consecutively.

We also remark that once a position (of an edge or of a pattern) or a CD has been determined, comparison with intended design values for the respective position or CD amounts to detecting positioning or CD errors, respectively.

A further object of the invention is to provide a computer program product used to measure a position and a size of a pattern on a surface of a substrate for the semiconductor industry, wherein the measurement and the analysis of the pattern placement are carried out with high precision and accuracy in a very fast way.

The above object is achieved by a computer program product disposed on a non-transitory computer readable medium for the measurement of pattern and/or edge placement and/or of a size of pattern on a surface of a substrate for the semiconductor industry, the computer program product comprising computer executable process steps operable to control a computer which is assigned to the inventive apparatus. With the computer a data preparation is carried out in order to generate at least one desired track curve along which a relative movement between at least one source for detection and an assigned detector, on the one hand, and the surface of the substrate on the other hand is directed. During the movement of a movable stage, measurement data of the detector signals are evaluated repeatedly. The detector signals originate from the source for detection which passes the patterned surface of the substrate during the movement of the movable stage. Parallel to the evaluation of the measurement data the movement of the movable stage is monitored. While the movable stage is controlled such that the source moves along the chosen track curve, such control can only be achieved with limited precision. The movement of the stage can, however, be monitored with a higher precision. Therefore, the actual movement of the source may deviate from the chosen track curve. The actual movement of the source defines a curve on the substrate which herein is referred to as trace line. A measured profile from the measurement data along the trace line is generated, wherein the measured profile represents the measured placement of the pattern (or edge) on the surface of the substrate. The measured profile can then be evaluated to determine a position of an edge or of a pattern, or a CD on the patterned surface. Prior to such an evaluation in embodiments the profile may be suitably pre-processed, for example to correct the profile for effects of nonlinearity in the measurement process; also, the profile may be subject to transformations using various algorithms.

In an embodiment, additionally, a design profile is generated from design data taken from a design database along the trace line; i.e. the design profile is a calculated profile which represents a profile that would result from measurements as used to obtain the measured profile along the same trace line, but for a pattern that corresponds to the design data, i.e. an ideal, error free pattern. Finally, the computer compares the measured profile and the design profile along the same trace line in order to determine a position of an edge or of a pattern, or a CD on the patterned surface and/or to detect placement errors or CD errors along the same trace line on the patterned surface.

The invention is based on the fact that the position of the source and/or detector, relative to the patterned surface of the substrate can be tightly monitored. This way, information about the trace line, which can also be considered a line joining the set of actual positions on the substrate from which data are taken by the detector, is well known. In an embodiment, the source for detection or the detector can be adjusted slightly (e.g., by deflector plates in case of a charged particle beam) in order to compensate for small deviations of the stage from the desired track curve. By this approach, the trace line can be brought closer to the track curve.

According to an embodiment of the invention, the at least one source for detection is a beam of light. The wavelength or the wavelength range of the beam of light is selected according to the required resolution and pattern structure on the surface of the substrate. For example, the beam of light is used in connection with a scanning near-field optical microscope (SNOM). According to another embodiment of the invention, the at least one source for detection is a particle beam, preferably an electron beam. A further embodiment of the at least one source for detection is an atomic force microscope (AFM). An AFM here is included into the source/detector wording used for the description of the invention. The AFM can be seen as a source for an intermolecular/interatomic force, as its tip provides a counterpart for the pattern on the substrate to be measured, between which counterpart and the pattern the force acts, and the components used to determine the force and/or regulate the distance between tip and pattern can be seen as the detector.

The source for detection can have a two-dimensional arrangement of a plurality of sources for detection. Preferably, the arrangement of the sources for detection could be in the form of a linear array or a matrix-like arrangement.

The computer of the inventive apparatus is configured to monitor a movement of the movable stage, so that the source for detection and the assigned detector travel along the trace line in a movement relative to the substrate, and to collect measurement data of the at least one detector along the trace line. The computer is connected at least to the position or displacement measurement system, the movable stage, the source for detection, and the detector via a network.

According to the inventive method the trace line is derived from the deviations from the desired track curve. To achieve information about the trace line, the movement of the movable stage is monitored continuously along the desired track curve during the movement of the stage. The trace line corresponds to the relative movement between the detector and the surface of the substrate. The design profile is derived from the design data along said trace line. Herein, in preferred embodiments, properties of the detector, of the source, and also characteristics of the interaction between the source and the pattern on the surface of the substrate are taken into account. More generally, the design profile is a calculated profile that corresponds to a measured profile that would result from a measurement of an error free pattern, i.e. a pattern corresponding to the design data, with the source and detector. In embodiments, source and detector herein are also modeled.

According to a preferred embodiment a correction of position errors of the movable stage is carried out by adjusting the source for detection or the detector. The adjustment of the source for detection or the detector is carried out on the fly.

From a comparison of the measured profile and the design profile, positions of the pattern (or of at least one edge, typically of plural edges) on the substrate or CDs are derived. This is done with the use of an algorithm implemented in the computer. The applied algorithms essentially comprise algorithms for edge detection, threshold-based techniques, or correlation-based techniques.

In a specific embodiment of the method according to the invention, the measured profile may be obtained at a first location, and the comparison with the design profile, or more generally the evaluation of the measured profile, may be performed at a second location. The first location and the second location may be geographically distinct. For example, obtaining the measured profile may be offered as a service to a customer; the measured profile is forwarded to the customer, maybe together with data describing the pertinent trace line, and the generation of the design profile and the comparison of measured profile and design profile are carried out by the customer. In such a case, usually, different computers will be involved in obtaining the measured profile and in the comparison of measured profile and design profile.

A favorable implementation of the inventive method is that the measured profile is matched against a design profile created by tracing the design data along the trace line. This design profile might even be adjusted to model the physical properties of the detection scheme.

In order to achieve reasonable precision and accuracy, the information generated along the trace line can be segmented, e.g. into blocks of 1 mm length, or such that a segment contains specific types of patterns. All position, CD, or any other type of measured information generated within a segment can be averaged and reported as the result. The reports of many segments (average position, CD, or other results) form a map. This map can be used to derive quality information about the substrate such as: registration, CD, overlay, sidewall angle, etc.

The advantages of the invention are multifold. The movable stage can always move along the desired track curve. This way, the surface can be sampled with a very high throughput. Additionally, the movable stage metrology errors along the trace line can be averaged. Moreover, the exact position of the movable stage relative to some well-defined alignment position (on the patterned surface) is known. Due to the data sampling on the fly, the intensity/energy deposited on the surface of the substrate is locally lower than for state of the art methods. This fact provides a better measurement accuracy. The number of samples that can be taken within a given time interval is higher by several orders of magnitude with the method according to the invention than with prior art methods. When using particle beams with the source for detection, the deposited energy (in a given area) is much lower compared to conventional techniques.

The general purpose of this invention is to measure position and size of patterns on a surface and compare with the intended design of the patterns. In semiconductor industries, exact pattern placement and size (CD), and the knowledge about the device pattern positions on the surface are crucial. With the invention it is possible to detect the pattern placement with high precision and accuracy in a very fast way.

By measuring the pattern placement on the surface of the substrate and CD very densely, error drivers which are "invisible" with state of the art tools can be revealed.

The invention provides an apparatus which can measure a patterned substrate (on-device and on-target) very fast. Thus, it is possible to detect pattern placement and CD errors inside critical structures which would normally lead to yield loss. Due to the scalability when using a multi-beam technique, it is possible to provide an in-line, high resolution, on-device (and on-target) registration, CD and overlay technique.

It is to be understood that both the foregoing general description and the following detailed description are exemplary and explanatory only, and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

Below, the invention and its advantages ill be further described with reference to the accompanying figures in which.

DETAILED DESCRIPTION OF THE INVENTION

In the figures like reference numerals are used for like elements or elements of like function. Furthermore, for the sake of clarity, only those reference numerals are shown in the figures which are necessary for discussing the respective figure.

The invented product is designed to register, but not restricted to registering, the positions of patterns on photolithographic masks or semiconductor wafers. In the following, only such systems are assumed, but the process holds true for other system types.

Figure 1:
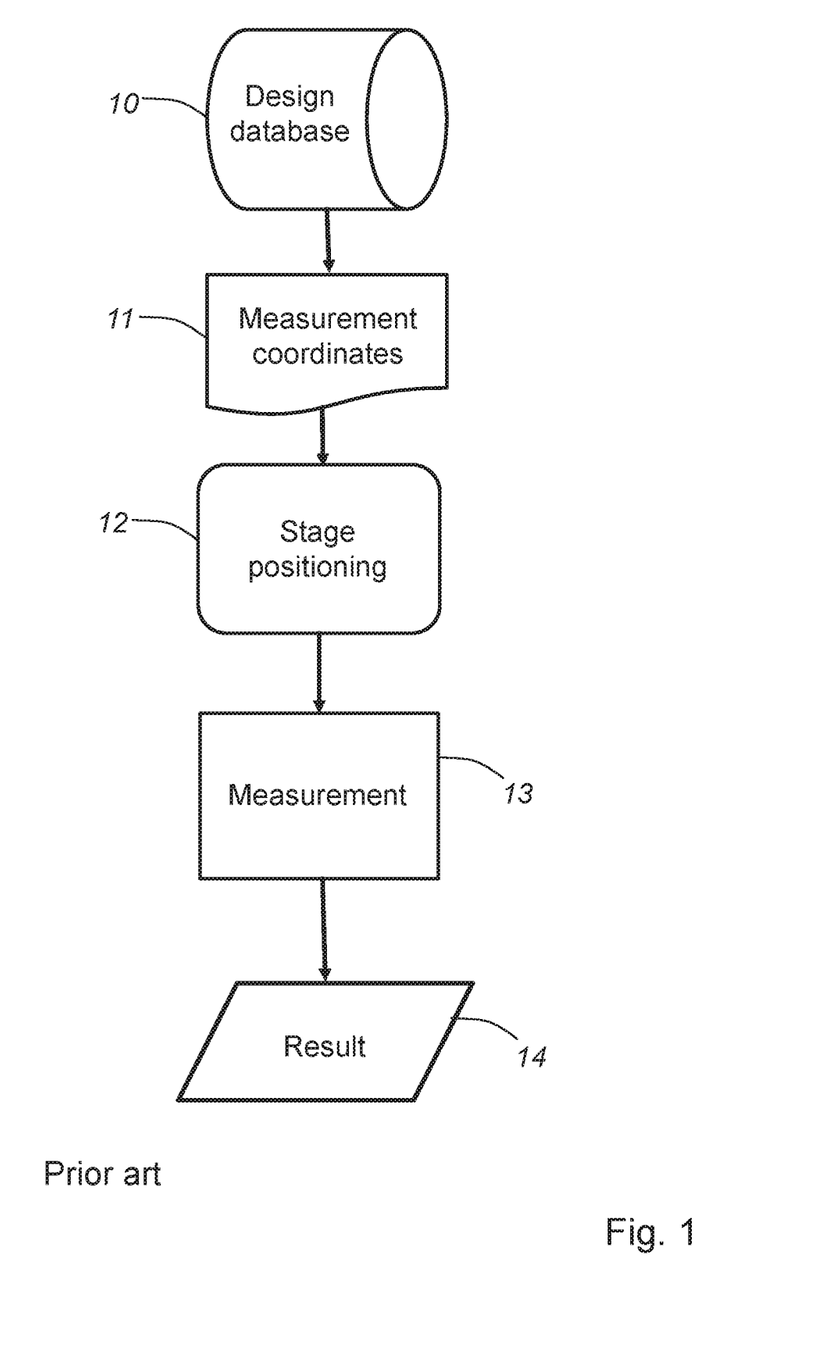
FIG. 1 is a schematic flowchart of a prior art method to determine the position and/or width (CD) of a pattern on a substrate.

FIG. 1 is a schematic flow chart of a prior art method. A movable stage is used to position the patterned surface (substrate) under a source for detection. The source for detection employs a detector to measure the pattern (position or width) on the substrate. One typical example of the prior art method extracts measurement coordinates 11 of the patterns to be measured from a design database 10 during the data preparation. The measurement coordinates 11 represent design data of a pattern to be measured. The design database 10 holds the design coordinates of the pattern on a substrate (see FIG. 2). Next, a stage positioning 12 of the movable stage (see FIG. 2) is initiated. The movable stage is positioned as close as possible to the desired design (pattern).

Furthermore, the movable stage is controlled to avoid unintended movement of the stage. Next, a measurement step 13 is carried out in order to determine a deviation between the design data of the pattern (position or width) and the measured data of the pattern (position or width). The result 14 of the measurement step 13 is reported in order to see the deviations between the design data of the pattern and the measured data of the pattern.

In general, the accuracy and precision of the stage control is worse than the detector accuracy and precision. As such, the measurement 13 is limited by the stage positioning system.

Figure 2:
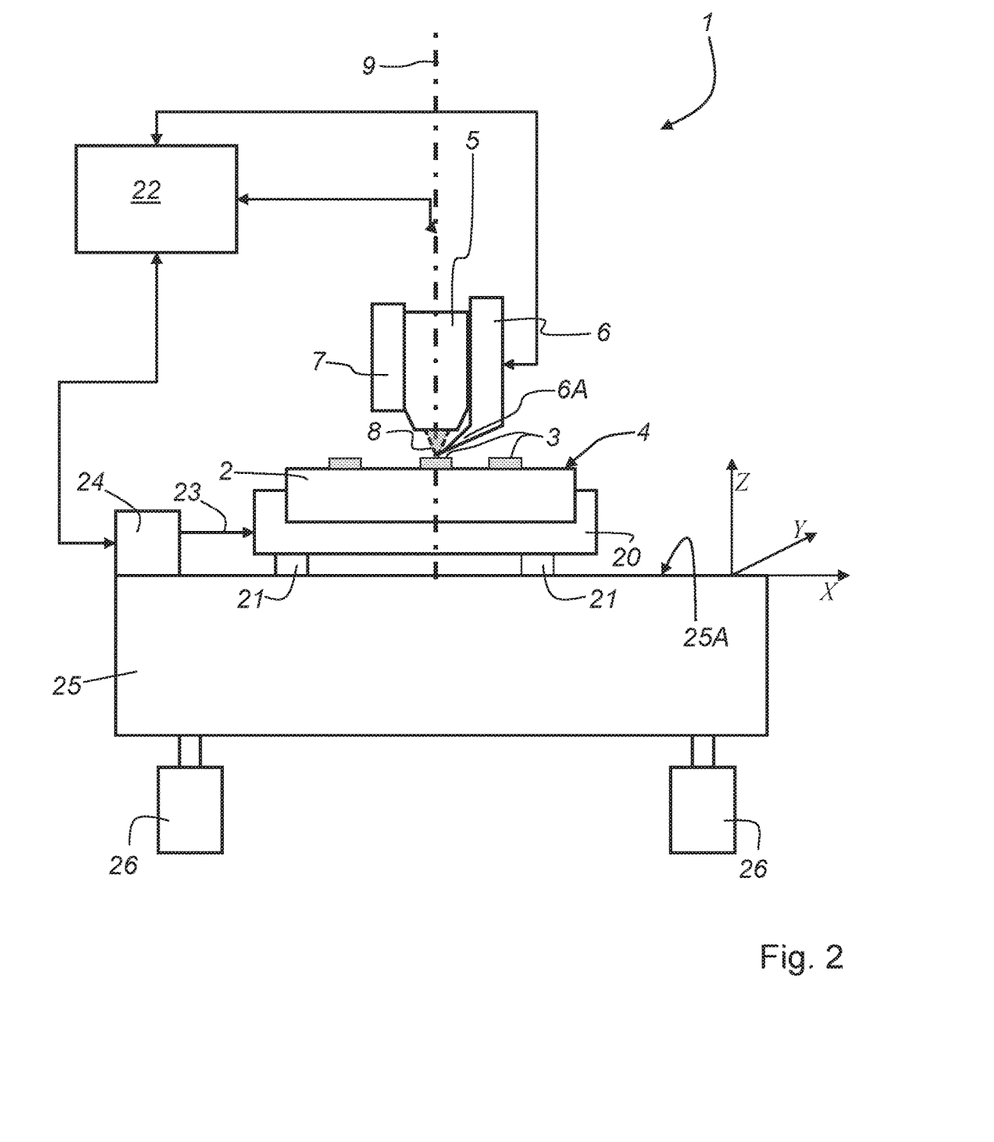
FIG. 2 is a schematic view of one selected embodiment of an apparatus for the measurement of pattern placement and/or size of a pattern on a surface of a substrate for the semiconductor industry.

FIG. 2 shows a schematic view of one selected embodiment of an apparatus 1 for the measurement of placement and/or size of a pattern 3 on a surface 4 of a substrate 2 for the semiconductor industry. The apparatus 1 has at least one source for detection 5; at least one detector 6 is assigned to the at least one source for detection 5. Such sources for detection 5 can be assigned to any device that carries out a relative scanning movement between the sources for detection 5 and the surface 4 of the substrate 2. A source for detection 5 could for example be based on a scanning near-field optical microscope, an electron beam system, or an atomic force microscope (AFM). The source for detection 5 may also comprise multiple sources for detection 5, which may be arranged in a linear array (see FIG. 3) according to one possible embodiment. A further embodiment (not shown) of the arrangement of the sources for detection 5 is an arrangement in arbitrarily shaped matrix form. For adjustment purposes of the measurement setup, in the embodiment shown here the source for detection 5 can be moved, if required, along a Z-coordinate direction Z. Alternatively, or additionally, also the substrate 2 may be moved along the Z-coordinate direction Z, for adjustment purposes. In the embodiment shown here, the illumination beam 8 for a scanning near-field optical microscope originates from the source for detection 5. The illumination beam 8 is focused along an axis of inspection 9 onto the surface 4 of the substrate 2. The adjustment purposes requiring movement along the Z-coordinate direction Z here include adjustment of the detector tip 6A. In different embodiments, especially when using particle beams, the focusing may of course be achieved by different means, including means not requiring movements of source or substrate along the Z-coordinate direction Z.

Note that in the following description, a single source for detection 5 is assumed, but the invention is not restricted to it. The source for detection 5 in combination with the detector 6 is used to measure the position and/or width (CD) of the pattern 3 on the surface 4 of the substrate 2 (e.g., photolithographic mask, semiconductor wafer). In order to obtain a relative movement along an X-coordinate direction X and a Y-coordinate direction Y, the substrate 2 is placed on a movable stage 20. In order to allow easily controllable movement, the movable stage 20 uses bearings 21 with a very low friction. The movable stage 20 is used on top of a table block 25. The surface 25A of the table block 25 is highly planar. In order to stabilize the apparatus 1 against external vibrations, the table block 25 and all other necessary components sit on a vibration isolation system 26. Furthermore, depending in particular on source and detector used, the entire apparatus, or, as the case may be, only source and detector, may be located in a vacuum chamber.

The exact position of the movable stage 20 relative to the source for detection 5 and the detector 6 is monitored using a precise and accurate position or displacement measurement system 24 (e.g., interferometer based using at least one beam of light 23). In case the position or displacement measurement system 24 is an interferometer-based system, the interferometer measures the position of the movable stage 20. As reference for the interferometer, a fixed mirror 7 is mounted to the source for detection 5 and the detector 6. Accordingly, the relative movement between the source for detection 5, the detector 6, and the movable stage 20 can be detected. In some embodiments, the displacement measurement system 24, for example an interferometer, measures the velocity of the movable stage 20 in addition to the position of the movable stage 20. The values for the velocity are then used to improve the accuracy of the measurement of the position of the movable stage 20. The displacement measurement system 24 may, in different embodiments, also include at least one encoder. Such an encoder may be used to measure the position and/or the velocity of the movable stage 20.

A computer 22 is connected to the position or displacement measurement system 24, a control (not shown) for movement of the movable stage 20, the source for detection 5, and the detector 6. The signal from the detector 6 of the source for detection 5 is taken along a trace line 42 (see FIG. 6) during the relative movement between the source for detection 5 and the patterned surface 4 of the substrate 2. The signal is evaluated using the computer 22. It is evident for a skilled person that the computer can be configured as a remote computer and the data to and from the apparatus can be sent via a network (wireless or wired). The exact positions of the pattern 3 along the trace line 42 create a specific measured profile 45 (see FIG. 7). The positions of the pattern 3 are derived from the measured profile 45. To accomplish this, various algorithms may be applied in the computer 22. Examples of such algorithms are edge detection, threshold-based techniques, or correlation-based techniques. The invention, however, is not restricted to the algorithms listed here.

The combination of a scanning detector 6 (movable along the track curve 50) with a highly accurate position or displacement measurement system 24 is the inventive idea of the present invention. The highly accurate position or displacement measurement system 24 allows registration of the measured profile 45 (detected profile) along the trace line 42 along the surface 4 of the patterned substrate 2.

Figure 3:
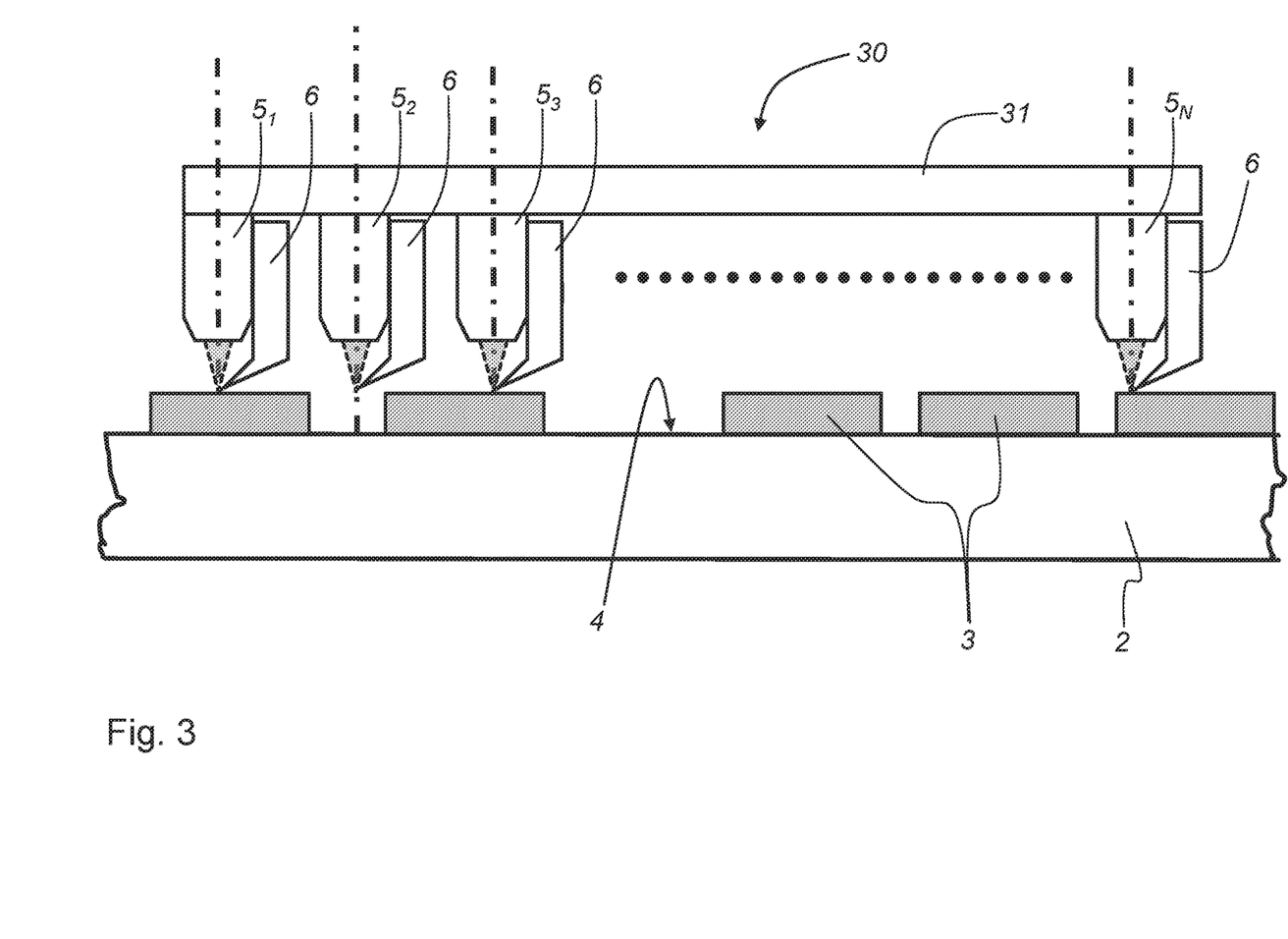
FIG. 3 is a schematic view of an embodiment to arrange a plurality of sources for detection in an array.

FIG. 3 shows a schematic view of an embodiment of the source for detection 5. Here a plurality of individual sources for detection $5_1, 5_2, \ldots, 5_N$ are arranged in the form of a linear array 30. In the embodiment shown here, the individual sources for detection $5_1, 5_2, \ldots, 5_N$ are mounted on a common carrier 31. Each of the individual sources for detection $5_1, 5_2, \ldots, 5_N$ has a detector 6 assigned. The arrangement shown in FIG. 3 allows the determination of positions of the pattern 3 along more than one trace line 42. The positions of the pattern 3 in the various trace lines 42 are detected from the measured profiles 45 of the individual trace lines 42. In different embodiments, plural sources may be used in connection with a common detector, or plural detectors may be assigned to a single source. Embodiments are also conceivable which exhibit a plurality of sources, and wherein at least two sources differ with respect to the number of detectors respectively assigned to them.

Figure 4:
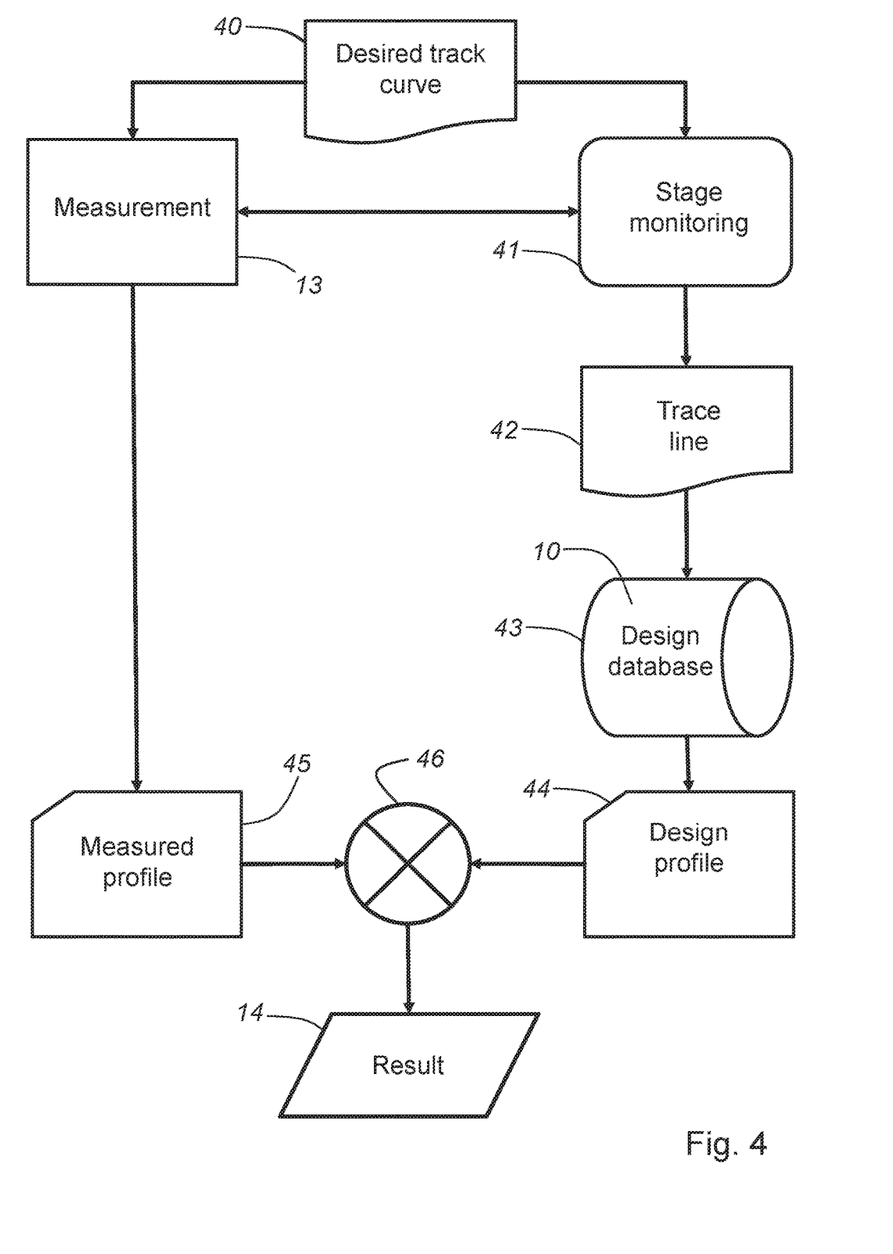
FIG. 4 is a schematic flowchart of an embodiment of the inventive method to determine the position and/or width (CD) of a pattern on a substrate in an efficient and less time consuming way.

The inventive method is illustrated by the flow chart of FIG. 4. The present invention relaxes the requirements for the control of the movable stage 20 and improves the measurement performance by monitoring the movement of the movable stage 20 tightly. The inventive method is implemented by a plurality of steps. Before the measurement of the position of the pattern 3 on the surface 4 of the substrate 2 is started, a data preparation is carried out. A generation step 40 of at least one desired track curve is carried out. The desired track curve is generated for example from design data of the substrate 2. This generation step 40 might also include some pre-computations in order to speed-up the evaluation process afterwards. After the generation step 40, the inventive method carries out a measurement step 13 and a stage monitoring step 41 in parallel. With the measurement step 13 a continuous measuring process is carried out by moving the movable stage 20 along the desired track curve 50, while monitoring deviations from the desired track curve with the stage monitoring step 41, to create the actual trace line 42. In a tracing step 43 of the scan (relative movement between the at least one source for detection 5 and the movable stage 20) an expected signal is generated. In the embodiment of the inventive method shown here a design profile 44 is extracted from the design data (design database 10) along the trace line 42 (for example by modelling the properties of the detector 6). From the measurement step 13 a measured profile 45 is obtained, representing the measured placement of the pattern 4 on the surface 3 of the substrate 2. The result 14 provides information about the deviations of the design profile 44 from the measured profile 45 (e.g., CD or position). The result 14 is obtained by a comparing step 46. Here the measured profile 45 is compared with the design profile 44 (expected profile) using various algorithms (e.g., edge detection or correlation).

The invention uses the fact that the position of the movable stage 20 can be monitored much better than it can be controlled. This way, the accuracy and precision of the trace line is only limited by the performance of the position or displacement measurement system 24 of the movable stage 20.

One additional difference between the concept of the prior art method and some embodiments of the inventive method like the one described above is the use of design database 10 to create a design profile 44. The prior art method uses the design database 10 during the preparation of the measurement. These embodiments of the invention use the design database 10 for data preparation (this is optional), and after the actual measurement to extract the design profile 44 (expected signal).

The measured profile 45 is compared against the design profile 44, based on design data along the trace line 42, in order to detect placement errors (registration metrology) or CD errors (CD metrology) over a very large area of the patterned surface 2.

A correction of position errors of the mechanical movable stage 20 is carried out by adjusting the source for detection 5 or the detector 6. The highly accurate position measurement can be used to compensate mechanical movable stage 20 position errors by adjusting the source for detection 5 or the detector 6 on the fly.

Figure 4A:
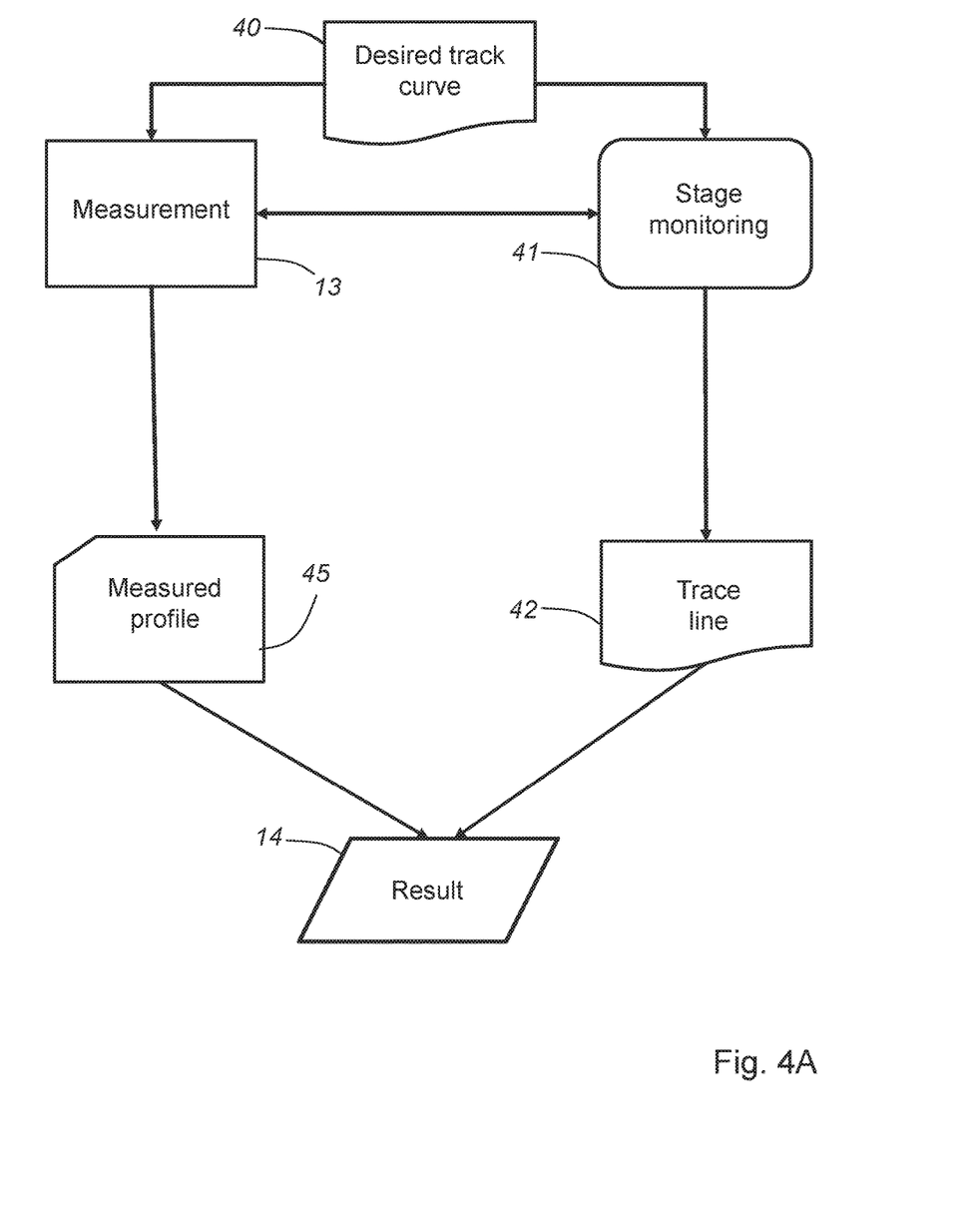
FIG. 4A is a schematic flowchart of a further embodiment of the inventive method to determine the position and/or width (CD) of a pattern on a substrate in an efficient and less time consuming way.

In different embodiments a design profile 44 is not generated. Instead, a measurement step 13 and a stage monitoring step 41 are used as described above to obtain a trace line 42 and a measured profile 45 along the trace line 42. The measured profile 45 is then evaluated in order to determine, as a result 14, a position of an edge or of a pattern, or a size of a pattern or a CD on the patterned surface. Such an embodiment is also illustrated in FIG. 4A.

Figure 5:
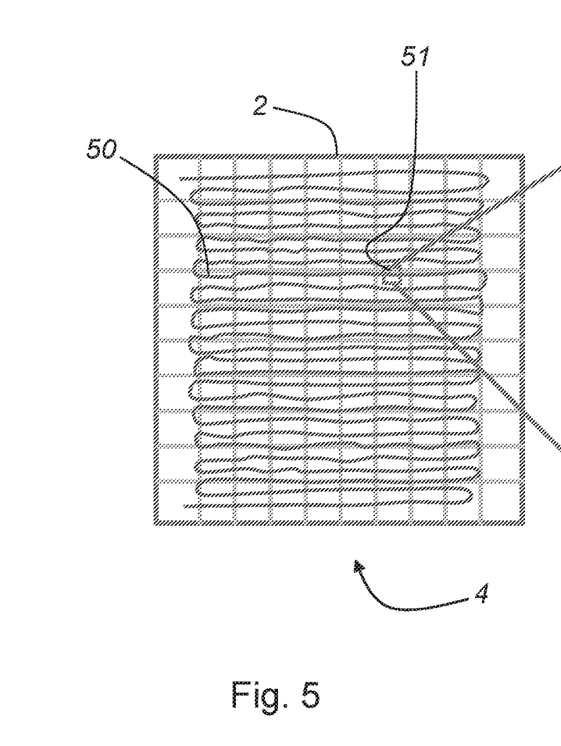
FIG. 5 is a schematic top view of a mask showing the track curve across the surface of the mask.

FIG. 5 is a schematic top view of a mask showing the track curve 50 across the surface 4 of the substrate 2 which is a mask. The source for detection 5 and the detector 6 are moved together across the surface 4 of the substrate 2 (mask).

Figure 6:
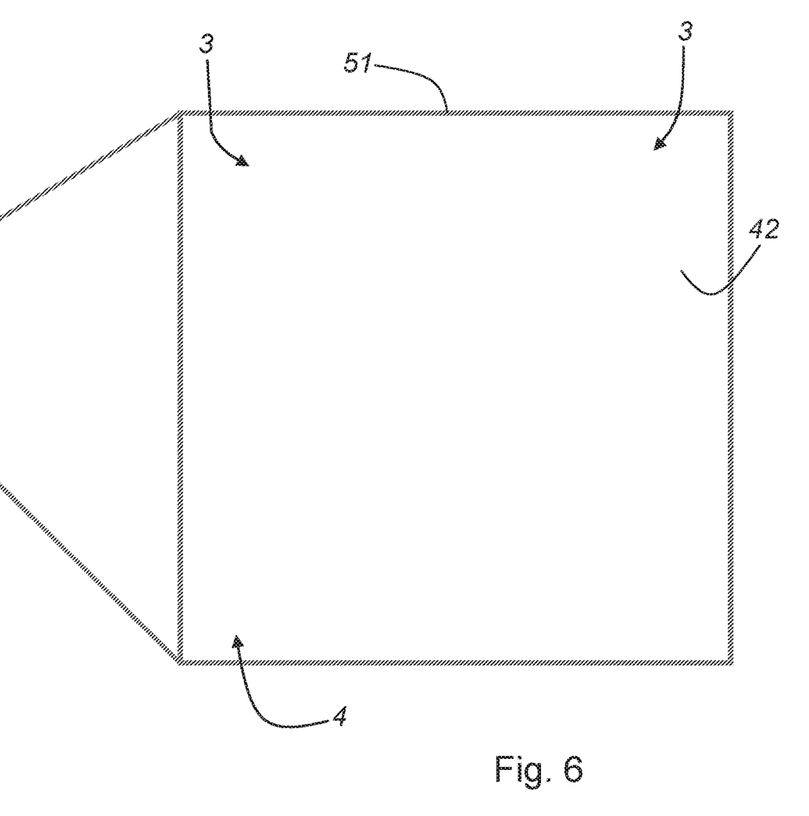
FIG. 6 is an enlarged view of the rectangle shown in FIG. 5.

FIG. 6 is an enlarged view of rectangle 51 shown in FIG. 5. Along the track curve 50 the signals from the patterned surface 4 are sampled. The track curve 50 is chosen in such a way that the sampling will cover anchor points (like specific patterns or targets used for other metrology tools) and relevant device patterns 3. In addition, it can be set up in a way to cover a sufficiently large signal for any angle (e.g., measurement in the X-coordinate direction X and measurement in the Y-coordinate direction Y). The invention is based on the fact that the position of the detector 6 relative to the patterned surface 4 of the substrate 2 can be tightly monitored. This way, information about the actual track curve 50, which is the trace line 42, along the surface 4 is well known. In an alternative implementation, the source for detection 5 or the detector 6 can be adjusted slightly (e.g., by deflector plates in case of a charged particle beam 8 originating from the source for detection 5, see FIG. 2) in order to compensate for small deviations of the movable stage 20 from the desired track curve 50.

Figure 7A:
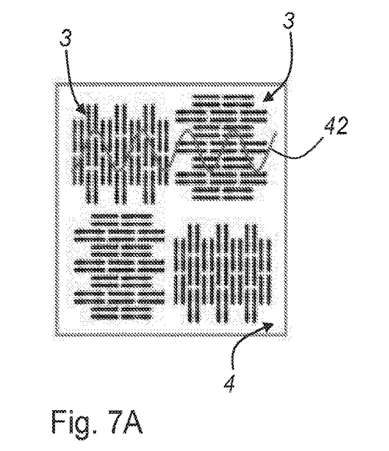
FIG. 7A is a schematic view of a trace line which is defined by the detector along its path across the surface.
Figure 7B:
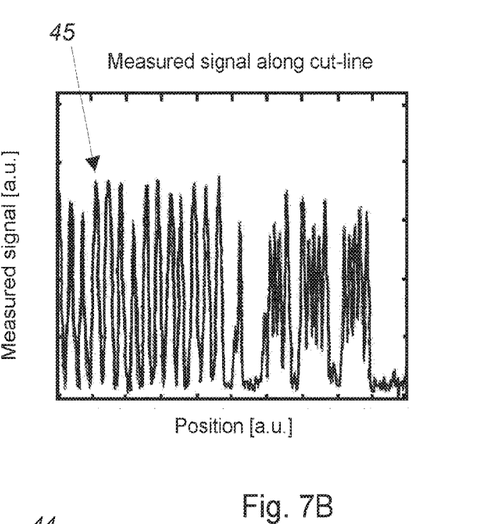
FIG. 7B is the measured profile which is derived from the signal captured by the detector during its movement across the surface of the substrate.

FIG. 7A is a schematic view of a trace line 42 which is defined by the detector 6 along its path across the surface 4 of the substrate 2. In FIG. 7B the measured profile 45 is shown, which is derived from the signal of detector 6 during its movement across the surface 4 of the substrate 2. This signal is evaluated using the computer 22. The exact positions of the pattern 3 along the trace line 42 create the measured profile 45. The positions of the pattern 3 are derived from the measured profile 45. To accomplish this, various algorithms might be applied. Examples of such algorithms are edge detection, threshold-based techniques or correlation-based techniques. The invention, however, is not restricted to the algorithms listed here.

Figure 8A:
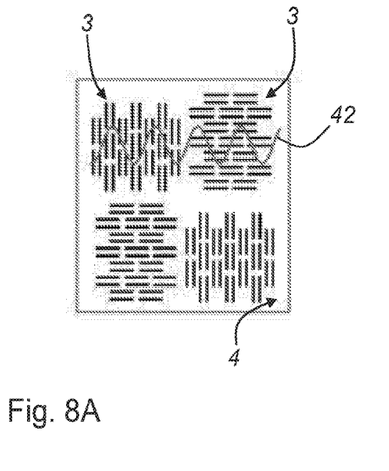
FIG. 8A is a schematic view of a trace line evaluated from design data along the path of the trace line across the surface.
Figure 8B:
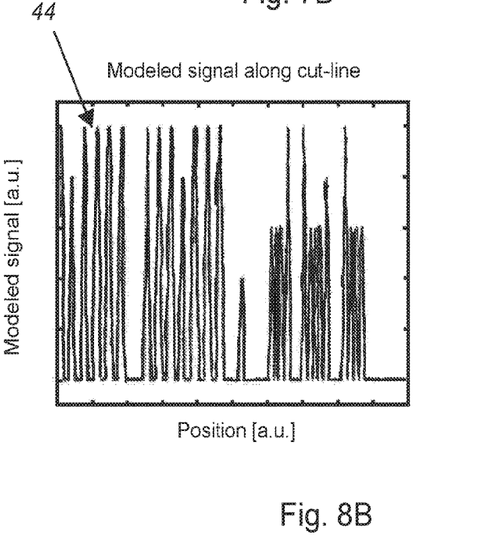
FIG. 8B is a design profile created by tracing the design data along the trace line.

FIG. 8A is a schematic view of the trace line 42 evaluated from design data of the design database 10 along the path of the trace line 42 across the surface 4 of the substrate 2. The trace line 42, derived from design data, passes the positions of the pattern 3 which have the same positions of the pattern which have been passed by the trace line 42 during the data sampling for the measured profile 45. In FIG. 8B a design profile 44 is shown, which has been created by tracing the design data along the trace line 42 (cut line).

In a favorable implementation, the measured profile 45 is matched against the design profile 44. This design profile 44 might even be adjusted to model the physical properties of the detection scheme.

In order to achieve reasonable precision and accuracy, the information generated along the trace line 42 can be segmented, e.g. into blocks of 1 mm length, or such that a segment contains specific types of patterns 3. All position, CD or any other type of measured information, generated within a segment, can be averaged and reported as the result of the comparing step 46. The reports of many segments (average position, CD or other results) form a map. This map can be used to derive quality information about the substrate 2 such as: registration, CD, overlay, sidewall angle, etc.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

LIST OF REFERENCE NUMERALS 1 apparatus
2 substrate
3 pattern
4 surface
5 source for detection
$5_1, 5_2, \ldots, 5_N$ source for detection
6 detector
6A detector tip
7 fixed mirror
8 illumination beam
9 axis of inspection
10 design database
11 measurement coordinates
12 stage positioning
13 measurement step
14 result
20 movable stage
21 bearings
22 computer
23 beam of light
24 position or displacement measurement system
25 table block
25A surface
26 vibration isolation system
30 linear array
31 common carrier
40 generation step
41 stage monitoring step
42 trace line
43 tracing step
44 design profile
45 measured profile
46 comparing step
50 track curve
51 rectangle
X X-coordinate direction
Y Y-coordinate direction
Z Z-coordinate direction

The invention claimed is:

1. An apparatus for the measurement of pattern placement and/or edge placement and/or size of a pattern on a surface of a substrate for the semiconductor industry comprising:
at least one source for detection;
at least one detector assigned to the at least one source for detection;
a movable stage for holding the substrate and providing a relative movement along a chosen track curve between the at least one source for detection and the assigned detector and the surface of the substrate;
a displacement measurement system for determining, during the movement of the movable stage, actual positions of the movable stage relative to the source for detection and the assigned detector and for deriving a trace line based on deviations from the track curve; and
a computer for correlating detected signals of the at least one detector along the derived trace line with the actual positions of the stage during the movement of the stage and for generating a design profile from design data of a design database along the trace line, wherein one or more properties of the detector, the source, or an interaction between the source and the pattern on a surface of the substrate are accounted for, and wherein the design profile is a calculated profile that corresponds to a measured profile that would result from a measurement of an error-free pattern.

2. The apparatus as claimed in claim 1, wherein the at least one source for detection is a beam of light used in connection with a scanning near-field optical microscope (SNOM).

3. The apparatus as claimed in claim 1, wherein the at least one source for detection is an atomic force microscope (AFM).

4. The apparatus as claimed in claim 1, wherein the at least one source for detection is a particle beam.

5. The apparatus as claimed in claim 4, wherein the particle beam is an electron beam.

6. The apparatus as claimed in claim 1, wherein at least one source for detection is a linear array or a matrix arrangement of a plurality of sources for detection.

7. The apparatus as claimed in claim 1, wherein the computer is configured to monitor movement of the movable stage, so that the source for detection and the assigned detector travel along the trace line, and to collect measurement data of the at least one detector along the trace line.

8. The apparatus as claimed in claim 7, wherein the computer is connected at least to the position or displacement measurement system, the movable stage, the source for detection and the detector via a network.

9. A method for measuring pattern placement and/or edge placement and/or a size of a pattern on a surface of a substrate for the semiconductor industry comprising the steps of:
   a. carrying out a data preparation for generating at least one desired track curve along which a relative movement between at least one source for detection and an assigned detector and the surface of the substrate is directed;
   b. repeatedly evaluating measurement data of detector signals from the patterned surface of the substrate during the movement of a movable stage and monitoring in parallel the movement of the movable stage;
   c. generating a measured profile from the measurement data along a trace line, wherein the measured profile represents the measured placement of the pattern on the surface of the substrate; and
   d. evaluating the measured profile in order to determine a position of an edge or of a pattern, or a CD on the patterned surface and/or to detect placement errors or CD errors along the same trace line on the patterned surface, wherein step d is carried out by:
      generating a design profile from design data of a design database along the trace line, wherein the trace line corresponds to the relative movement between the detector and the surface of the substrate, and the design profile is extracted from the design data along the trace line by modelling the properties of at least one of: the source, the detector, or interaction between the source and the pattern, and wherein the design profile is a calculated profile that corresponds to a measured profile that would result from a measurement of an error-free pattern; and
      comparing the measured profile and the design profile along the same trace line in order to determine a position of an edge or of a pattern, or a CD along the same trace line on the patterned surface and/or to detect placement errors or CD errors along the same trace line on the patterned surface.

10. The method of claim 9, wherein the trace line is derived from the deviations from the desired track curve, wherein the movement of the movable stage along the desired track curve is continuously monitored during the movement of the stage.

11. The method of claim 9, wherein a correction of position errors of the movable stage is carried out by adjusting the source for detection or the detector, wherein the adjustment of the source for detection or the detector is carried out on the fly.

12. The method of claim 9, wherein a position of the edge or of the pattern on the substrate or the CD are derived in step d with the use of an algorithm implemented in a computer, wherein the algorithm comprises algorithms for edge detection, threshold-based techniques, or correlation-based techniques.

13. The method of claim 9, wherein the steps b and c are carried out at a first location, and step d is carried out at a second location, the first location and the second location being geographically distinct.

14. The method of claim 9, wherein the steps b and c are carried out at a first location, and steps e and f are carried out at a second location, the first location and the second location being geographically distinct.

15. A computer program product disposed on a non-transitory computer readable medium operable to control at least one computer to perform the method of claim 9.

16. A computer program product disposed on a non-transitory computer readable medium for the measurement of edge and/or pattern placement and/or size of a pattern on a surface of a substrate for the semiconductor industry, the computer program product comprising computer executable process steps operable to control at least one computer to:
   carry out a data preparation for generating at least one desired track curve along which a relative movement between at least one source for detection and an assigned detector and the surface of the substrate is directed;
   continuously evaluate measurement data of detector signals from the patterned surface of the substrate during the movement of a movable stage and monitor in parallel the movement of the movable stage;
   generate a measured profile from the measurement data along a trace line, wherein the measured profile represents the measured placement of the pattern on the surface of the substrate, wherein the trace line is derived from deviations from the desired track curve, wherein the trace line corresponds to the relative movement between the detector and the surface of the substrate and the design profile is extracted from the design data along the trace line by modelling the properties of at least one of: the detector, the source, interaction between the source and the pattern;
   generate a design profile from design data of a design database along the trace line, wherein the design profile is a calculated profile that corresponds to a measured profile that would result from a measurement of an error-free pattern; and
   compare the measured profile and the design profile along the same trace line in order to detect placement errors or CD errors along the same trace line on the patterned surface.

17. The computer program product of claim 16, wherein the movement of the movable stage along the desired track curve is continuously monitored during the movement of the stage.

18. The computer program product of claim 16, wherein a correction of position errors of the movable stage is carried out by adjusting the source for detection or the detector, wherein the adjustment of the source for detection or the detector is carried out on the fly.

19. The computer program product of claim 16, wherein from a comparison of the measured profile and the design profile positions of the pattern on the substrate or CDs are derived with the use of an algorithm implemented in a computer, wherein the algorithm comprises algorithms for edge detection, threshold-based techniques, or correlation-based techniques.

* * * * *